(12) United States Patent
Heckmann et al.

(10) Patent No.: US 11,457,545 B2
(45) Date of Patent: Sep. 27, 2022

(54) THERMAL-CONTROL SYSTEM OF A MEDIA-STREAMING DEVICE AND ASSOCIATED MEDIA-STREAMING DEVICES

(71) Applicant: Google LLC, Mountain View, CA (US)

(72) Inventors: Frédéric Heckmann, Taipei (TW); Ihab A. Ali, Cupertino, CA (US)

(73) Assignee: Google LLC, Mountain View, CA (US)

( * ) Notice: Subject to any disclaimer, the term of this patent is extended or adjusted under 35 U.S.C. 154(b) by 81 days.

(21) Appl. No.: 17/035,238

(22) Filed: Sep. 28, 2020

(65) Prior Publication Data

US 2022/0104386 A1  Mar. 31, 2022

(51) Int. Cl.
*H05K 7/20* (2006.01)
*H01L 23/373* (2006.01)
*H05K 9/00* (2006.01)

(52) U.S. Cl.
CPC ....... *H05K 7/2039* (2013.01); *H01L 23/3735* (2013.01); *H05K 7/20472* (2013.01); *H05K 9/006* (2013.01); *H05K 7/20445* (2013.01)

(58) Field of Classification Search
CPC ...... H05K 7/2039–20518; H05K 9/006; H01L 23/3735; H01L 23/552; H04R 1/025
See application file for complete search history.

(56) References Cited

U.S. PATENT DOCUMENTS

| 5,403,782 | A | 4/1995 | Dixon et al. | |
| 10,319,213 | B1 * | 6/2019 | Conner | G01K 3/005 |
| 10,725,531 | B1 * | 7/2020 | Ichapurapu | H04N 21/4424 |
| 2011/0149533 | A1 | 6/2011 | Luo et al. | |
| 2014/0055957 | A1 | 2/2014 | Yang et al. | |
| 2015/0075186 | A1 * | 3/2015 | Prajapati | F25B 21/02 62/3.7 |
| 2015/0268704 | A1 * | 9/2015 | Chiriac | F28F 21/00 165/185 |
| 2016/0043453 | A1 | 2/2016 | Ebner et al. | |
| 2016/0157333 | A1 | 6/2016 | Kim et al. | |
| 2016/0189502 | A1 | 6/2016 | Johnson et al. | |
| 2016/0255184 | A1 | 9/2016 | Hwang | |

(Continued)

FOREIGN PATENT DOCUMENTS

EP  1233666  8/2002

OTHER PUBLICATIONS

Orsan, "What's Inside?—vol. 2: Dropcam Pro", Accessed on Apr. 21, 2020 from https://medium.eom/@candemir/whats-inside-vol-2-dropcam-pro-f458d96ecc9a, Dec. 21, 2014.

(Continued)

*Primary Examiner* — Zachary Pape
*Assistant Examiner* — Amir A Jalali
(74) *Attorney, Agent, or Firm* — Byrne Poh LLP

(57) ABSTRACT

This document describes a thermal-control system that is integrated into a media-streaming device. The thermal-control system includes a combination of heat spreaders and materials with high thermal-conductivity. The thermal-control system may spread, transfer, and dissipate energy from a thermal-loading condition effectuated upon the media-streaming device to concurrently maintain temperatures of multiple thermal zones on or within the media-streaming device at or below multiple respective prescribed temperature thresholds.

20 Claims, 9 Drawing Sheets

(56) References Cited

U.S. PATENT DOCUMENTS

| | | |
|---|---|---|
| 2017/0090532 A1 | 3/2017 | Koukami et al. |
| 2018/0143671 A1 | 5/2018 | Lee et al. |
| 2018/0343772 A1* | 11/2018 | Raghupathy ......... F16M 13/022 |
| 2019/0045664 A1 | 2/2019 | Chang et al. |
| 2019/0051967 A1 | 2/2019 | Ryu et al. |
| 2019/0089872 A1 | 3/2019 | Rukes et al. |
| 2019/0310695 A1* | 10/2019 | North ................. G05D 23/1917 |
| 2019/0373314 A1 | 12/2019 | Collins et al. |
| 2021/0099779 A1* | 4/2021 | Tang ....................... G06F 1/181 |
| 2021/0100065 A1* | 4/2021 | Lee ...................... H05K 1/0203 |

OTHER PUBLICATIONS

International Search Report and Written Opinion dated Jan. 24, 2022 in International Patent Application No. PCT/US2021/052298.

* cited by examiner

THERMAL-CONTROL SYSTEM OF A MEDIA-STREAMING DEVICE AND ASSOCIATED MEDIA-STREAMING DEVICES

BACKGROUND

Media-streaming devices are widely used to wirelessly stream media to an auxiliary electronic device. As an example, a media-streaming device may receive, through a wireless local area network (WLAN), data from a media-service provider and convert the data to stream video and audio content to a television having a display and speakers. In this instance, which is an example of an early-generation media-streaming device, integrated circuit (IC) components may exude a thermal-loading condition that can approach 2.5 Watts (W). To manage the thermal-loading condition, the media-streaming device may include a thermal-control system that maintains a thermal zone of the media-streaming device to be at or below a single, prescribed temperature threshold. Such a thermal-control system may include a single, dedicated heat spreader that is made from a stainless-steel material up to 1.0 millimeter (mm) thick.

Media-streaming devices may include high-definition multimedia interface (HDMI) hardware and integrated-circuit (IC) devices that afford advanced functionalities over simply receiving and converting data to stream video and audio content. In this instance, the SoC IC device may exude a thermal-loading condition upon the media-streaming device that can approach 4.0 W.

The thermal-control system, including the single, dedicated heat spreader made from stainless steel, may have multiple drawbacks managing such a thermal-loading condition. As a first example drawback, to be capable of dissipating up to 4.0 W of heat, properly sizing the thick stainless steel heat spreader may result in the media-streaming device having a hanging-weight that damages structures used to connect the media-streaming device to the auxiliary electronic device (e.g., a universal serial bus (USB) port of the media-streaming device, an HDMI connector/structure of the media-streaming device, an HDMI port of the auxiliary electronic device). As a second example drawback, the thermal-control system may lead to uneven spread and transfer of heat within the media-streaming device, leading to hot spots that may result in (i) damage to one or more IC devices of the media-streaming device and (ii) a surface of one or more housing components of the media-streaming device exceeding a prescribed ergonomic touch-temperature limit.

SUMMARY

This document describes a thermal-control system that is integrated into a media-streaming device. The thermal-control system includes a combination of heat spreaders and materials with high thermal-conductivity. The thermal-control system may spread, transfer, and dissipate energy from a thermal-loading condition effectuated upon the media-streaming device to concurrently maintain temperatures of multiple thermal zones on or within the media-streaming device at or below prescribed temperature thresholds.

In some aspects, a thermal-control system for a media-streaming device and associated media streaming devices is described. The thermal-control system includes a first thermal-control subsystem having a first graphite sheet that is fixed to a first generally concave interior surface of a first housing component and a first heat spreader that is separated from the first graphite sheet by a first air gap. The first thermal-control subsystem further includes a first thermal interface material (TIM) located between the first heat spreader and a first IC device mounted to a first generally planar surface of a PCB.

The thermal-control system also includes a second thermal-control subsystem having a second graphite sheet that is fixed to a second generally concave interior surface of a second housing component, where the second generally concave interior surface of the second housing component faces the first generally concave interior surface of the first housing component. The second thermal-control subsystem further includes a second heat spreader that is separated from the second graphite sheet by a second air gap. A second thermal interface material is located between the second heat spreader and a second IC device that is mounted to a second surface of the PCB that is opposite the first surface of the PCB.

In other aspects, a media-streaming device is described. The media-streaming device includes a housing having a first housing component that is joined to a second housing component. The media-streaming device also includes an SoC IC device mounted to a first surface of a printed circuit board (PCB) that is positioned within the housing. A thermal-control system, also positioned within the housing, is configured to maintain temperatures throughout the media-streaming device during a thermal-loading condition. During the thermal-loading condition, the thermal-control system concurrently maintains (i) a first temperature of a first thermal zone including the SoC IC device at or below a first prescribed temperature threshold, (ii) a second temperature of a second thermal zone including a second surface of the PCB at or below a second prescribed temperature threshold, (iii) a third temperature of a third thermal zone including a first exterior surface of the first housing component at or below a third prescribed temperature threshold, and (iv) a fourth temperature of a fourth thermal zone including a second exterior surface of the second housing component at or below a fourth prescribed temperature threshold.

The details of one or more implementations are set forth in the accompanying drawings and the following description. Other features and advantages will be apparent from the description, the drawings, and the claims. This summary is provided to introduce subject matter that is further described in the Detailed Description. Accordingly, a reader should not consider the summary to describe essential features nor limit the scope of the claimed subject matter.

BRIEF DESCRIPTION OF THE DRAWINGS

The details of one or more aspects of a thermal-control system for a media-streaming device are described below. The use of the same reference numbers in different instances in the description and the figures indicate similar elements.

DETAILED DESCRIPTION

Figure 1:
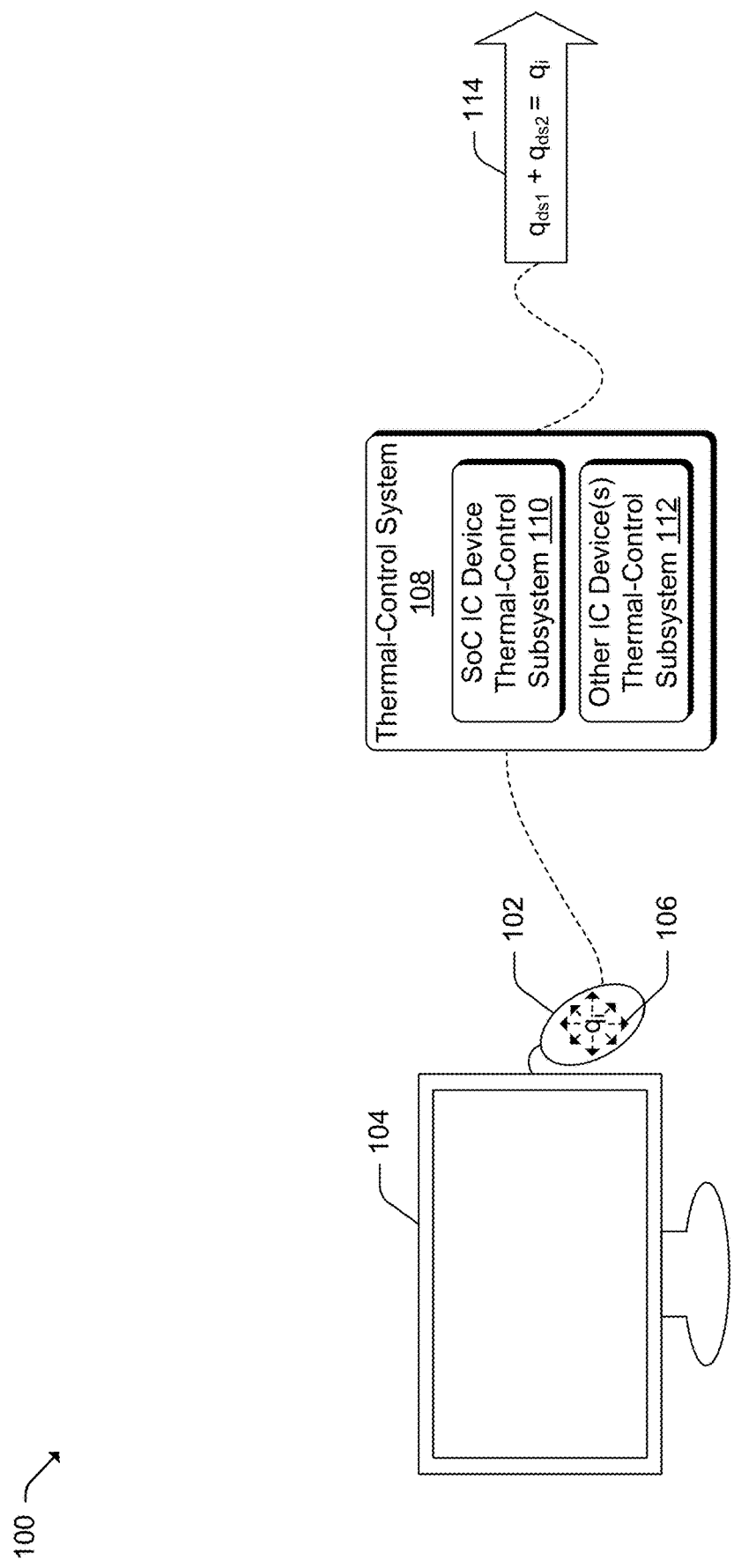
FIG. 1 illustrates an operating environment having an example media-streaming device connected to a television.

This document describes a thermal-control system that is integrated into a media-streaming device. The thermal-control system is lightweight and includes a combination of heat spreaders and low thermal-resistance materials. The thermal-control system may spread, transfer, and dissipate energy from a thermal-loading condition effectuated upon the media-streaming device to concurrently maintain temperatures of multiple thermal zones on or within the media-streaming device at or below multiple, respective prescribed temperature thresholds.

While features and concepts of the described thermal-control system can be implemented in any number of different environments and devices, aspects are described in the context of the descriptions and examples below.

Heat transfer, in general, is energy that is in transit due to a temperature difference. If one or more temperature differences exist across components of a system, such as the media-streaming device, heat (e.g., energy in Joules (J)) will transfer from higher temperature zones to lower temperature zones to reduce the temperature differences. There are several mechanisms for heat transfer across the components of the system to minimize temperature differences, including convection, radiation, and conduction.

Convection, or heat transfer from a surface due to movement of molecules within fluids such as gases and liquids, may be quantified by equation (1) below:

$$q_{conv} = hA(T_s - T_\infty) \quad (1)$$

For equation (1), $q_{conv}$ represents a rate of heat transfer from a surface through convection (e.g., in J per second or Watts (W)), h represents a convection heat transfer coefficient (e.g., in W per meter squared ($W/m^2$)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents an area of a surface (e.g., in $m^2$).

Radiation, or heat transfer from a surface through electromagnetic radiation, may be quantified by equation (2) below:

$$q_{rad} = \varepsilon A \sigma (T_s^4 - T_{surr}^4) \quad (2)$$

For equation (2), $q_{rad}$ represents a rate of heat transfer through radiation (e.g., in W), ε represents emissivity (dimensionless), σ represents the Stefen-Boltzmann constant (e.g., $\sigma = 5.67 \times 10^{-8}$ $W/(m^2 \cdot K^4)$), $T_s$ represents a temperature of a surface (e.g., in K or ° C.), and $T_{surr}$ represents a temperature of surroundings of the surface (e.g., in K or ° C.). The term A represents an area of the surface (e.g., in $m^2$).

Conduction, or heat transfer through a solid body through atomic and molecular activity, may be quantified by equation (3) below:

$$q_{cond} = -kA\frac{dT}{dx} \quad (3)$$

For equation (3), $q_{cond}$ represents a rate of heat transfer in a solid material through conduction (e.g., in W), k represents a high thermal-conductivity of the solid material (e.g., in $W/(m \cdot K)$), and dT/dx represents a temperature gradient through the solid material (e.g., in K/m or ° C./m). The term A represents a cross-sectional area of the solid material (e.g., in $m^2$).

A media-streaming device may include a thermal-control system that transfers heat using one or more of the mechanisms described above. In general, and in accordance with equations (1) and (2), rates and/or quantities of heat transfer can be varied by increasing or decreasing surface areas for convection and/or radiation within the media-streaming device (e.g., increasing or decreasing surface areas of heat spreading mechanisms).

In accordance with equation (3) and within the thermal-control system, rates and/or quantities of heat transfer can also be varied by introducing, between surfaces, one or more TIMs that have a high thermal-conductivity. Through careful implementation of heat spreaders and the use of TIMs having a high thermal-conductivity, the thermal-control system can concurrently maintain temperatures of different thermal zones at or below different prescribed temperature thresholds during a thermal-loading condition.

Through conduction, convection, and radiation, as described above, the thermal-control system may transfer heat (e.g., energy) originating from within the media-streaming device to housing components (e.g., external skins) for dissipating to the external environment through convection and/or radiation. Temperature variation across the surfaces of the housing components, in general, decreases as the quality of the thermal-control system improves. A dimensionless metric that is known as the Coefficient of Thermal Spreading (CTS) quantifies this quality and may be given by equation (4) below:

$$CTS = \frac{\theta_{ave}}{\theta_{max}} = (T_{ave} - T_{ambient})/(T_{max} - T_{ambient}) \quad (4)$$

For equation (4), CTS is a dimensionless metric that ranges from 0 to 1. The equation is a ratio of the average temperature rise on a surface to a peak temperature rise on the surface, where $T_{ave}$ (e.g., the average temperature across the surface), $T_{max}$ (e.g., the maximum temperature at a location on the surface), and $T_{ambient}$ (e.g., the surrounding ambient temperature) can be measured in K or ° C. As the quality of a thermal-control system improves, this ratio approaches unity.

As a contrasting example, the thermal-control system of a media-streaming device (as described earlier) may result in the media-streaming device having a CTS that is equal to approximately 0.50. As described herein, however, the thermal-control system may result in the media-streaming device having a CTS that approaches approximately 0.90.

FIG. 1 illustrates an operating environment 100 having an example media-streaming device 102 connected to a television 104. Although illustrated as being connected to the television 104, the media-streaming device 102 may be connected to other types of devices having a display and/or audio capability (e.g., a tablet, a notebook, a laptop, a computing device, a projector).

In the operating environment 100, multiple IC devices are generating an internal heat load 106 (e.g., $q_i$) within the media-streaming device 102. As an example, the internal heat load 106 may be generated within the media-streaming device at a rate of up to 4 W.

In addition to an SoC IC device, the multiple IC devices may include a memory IC device and/or a wireless-communication IC device (e.g., a wireless-communication IC device for wirelessly communicating in accordance with an IEEE 802.11 wireless-communication protocol (Wi-Fi), a Fifth-Generation New Radio (5GNR) protocol, and so on). The multiple IC devices, in conjunction with HDMI hardware that may be part of the media-streaming device 102, may support interactions with multiple streaming applications, support wireless-connectivity across different wireless-communication protocols, interact with a remote control, and execute an operating system to control a digital media player, a set-top box, a soundbar, and/or a television.

The media-streaming device 102 includes a thermal-control system 108. The thermal-control system 108 includes an SoC IC device thermal-control subsystem 110 and an other IC device(s) thermal-control subsystem 112. The SoC IC device thermal-control subsystem 110 may be a first thermal-control subsystem that is in thermal contact with an SoC IC device of the media-streaming device 102. The other IC device(s) thermal-control subsystem 110 may be a second thermal-control subsystem that is in thermal contact with other IC devices of the media-streaming device 102 (e.g., a memory IC device, a wireless-communication IC device, and so on).

In general, the thermal-control system 108 (e.g., the SoC IC device thermal-control subsystem 110 in conjunction with the other IC device(s) thermal-control subsystem 112) may spread and transfer energy from a thermal-loading condition (e.g., the internal heat load 106) effectuated upon the media-streaming device 102 to concurrently maintain temperatures of multiple thermal zones within the media-streaming device 102 at or below multiple, respective temperature thresholds. The thermal-control system 108 may transfer heat for external dissipation through multiple surfaces of the media-streaming device 102. As an example, and in some instances, the externally dissipated heat 114 through two surfaces of the media-streaming device may be equal to the internal head load (e.g., $q_{ds1} + q_{ds2} = q_i$).

Figure 2:
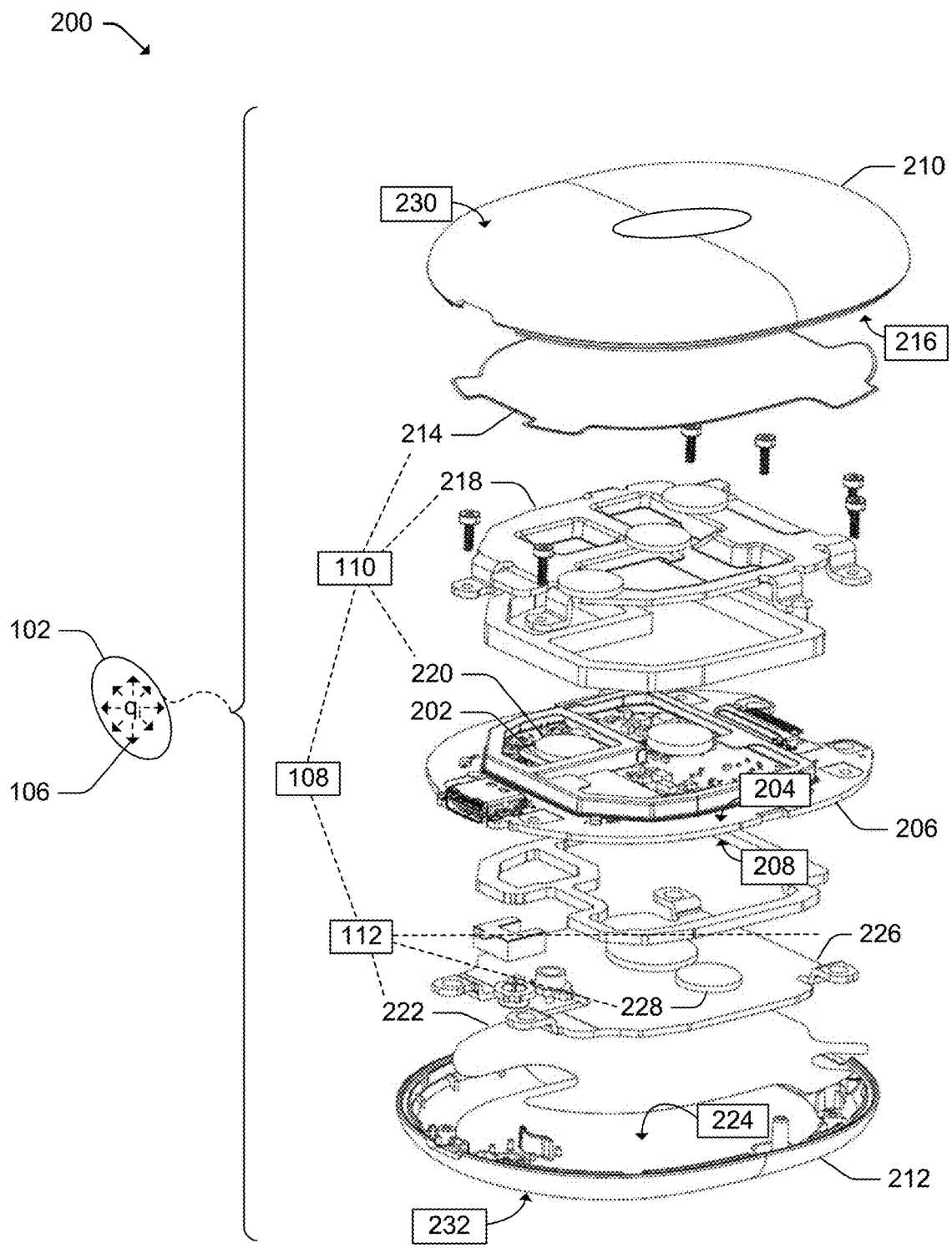
FIG. 2 illustrates an exploded, isometric view of an example media-streaming device in accordance with one or more aspects.

FIG. 2 illustrates an exploded isometric view 200 of the media-streaming device 102 of FIG. 1. The media-streaming device 102 includes an SoC IC device 202 that is mounted to a first surface 204 of a PCB 206. The SoC IC device 202 may include logic and/or memory integrated circuitry that processes data to render video and/or audio content for streaming to a television (e.g., the television 104 of FIG. 1). As part of processing the data to render the video and/or audio content, the SoC IC device 202 may contribute to the internal heat load 106. The PCB 206 includes a second surface 208, to which one or more other IC devices (e.g., a wireless-communication IC device, a memory IC device, passive resistors, and/or capacitor IC devices, and so on, which are not visible in FIG. 2) are mounted.

The media-streaming device 102 further includes a first housing component 210 and a second housing component 212. The second housing component 212 is substantially complementary to the first housing component 210. In general, the first housing component 210 and the second housing component 212 may join to form an assembled housing for the media-streaming device 102. The shape of the media-streaming device 102 (e.g., when the first housing component 210 and the second housing component 212 are joined to form the assembled housing) may be an oblate spheroid.

The media-streaming device 102 includes the thermal-control system 108 having two thermal-control subsystems (e.g., the SoC IC device thermal-control subsystem 110 and the other IC device(s) thermal-control subsystem 112). The SoC IC device thermal-control subsystem 110 may include a combination of heat spreaders and low thermal-resistance materials to concurrently spread and transfer energy (e.g., heat) throughout the media-streaming device 102 for eventual dissipation. As illustrated in FIG. 2, the SoC IC device thermal-control subsystem 110 includes a first graphite sheet 214 that adheres to a first generally concave interior surface 216 of the first housing component 210. The SoC IC device thermal-control subsystem 110 also includes a first heat spreader 218 and one or more first TIM(s) 220. In some instances, at least one of the first TIM(s) 220 may be located between, and in thermal contact with, the SoC IC device 202 and the first heat spreader 218. Furthermore, and in some instances, the first heat spreader 218 may include flanges, holes, and/or pins to align the first heat spreader 218 to the PCB 206. In addition, the first heat spreader 218 may include one or more subassemblies (e.g., multiple conductive elements combined to render the first heat spreader 218).

The other IC device(s) thermal-control subsystem 112 may include another combination of heat spreaders and low thermal-resistance materials to concurrently spread and transfer energy (e.g., heat) throughout the media-streaming device 102 for eventual dissipation. The other IC device(s) thermal-control subsystem 112 may include a second graphite sheet 222 that adheres to a second generally concave interior surface 224 of the second housing component 212. The other IC device(s) thermal-control subsystem 112 also includes a second heat spreader 226 and one or more second TIM(s) 228. In some instances, at least one of the second TIM(s) 228 may be located between an IC device (not illustrated in FIG. 1) and the second heat spreader 226. Furthermore, and in some instances, the second heat spreader 226 may include flanges, holes, and/or pins to align the second heat spreader 226 to the PCB 206. Furthermore, and in some instances, the second heat spreader 226 may include one or more subassemblies (e.g., multiple conductive elements combined to render the second heat spreader 226).

In general, the thermal-control system 108 dissipates energy (e.g., heat from the internal heat load 106 of FIG. 1) using convection and radiation heat transfer modes throughout the media-streaming device 102 for eventual dissipation to a surrounding environment. Dissipation may occur through the first exterior surface 230 of the first housing component 210 or through the second exterior surface 232 of the second housing component 212, or through both the first exterior surface 230 of the first housing component 210 and the second exterior surface 232 of the second housing component 212.

Figure 3:
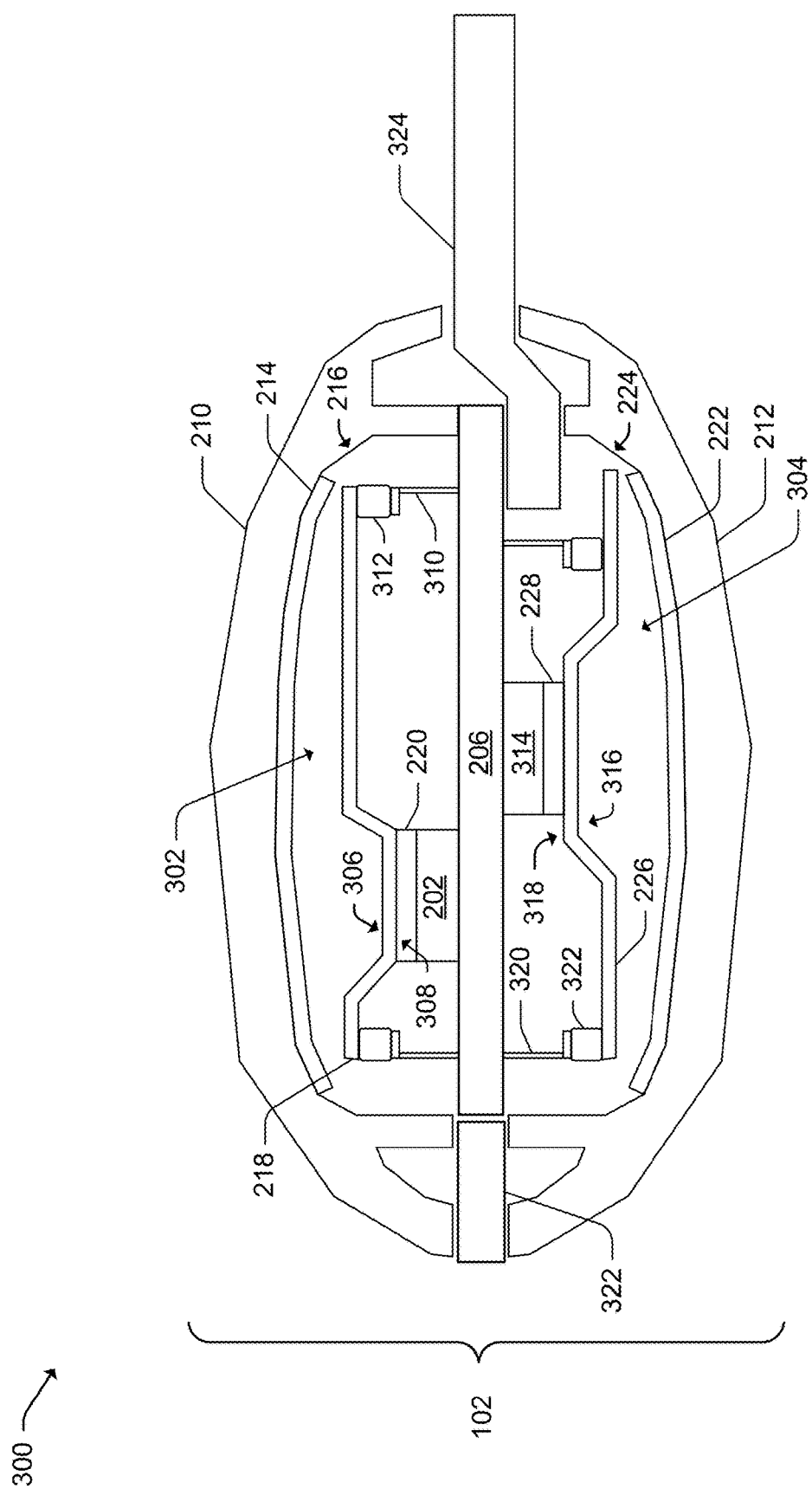
FIG. 3 illustrates a cross-section view of an example media-streaming device having a thermal-control system.

FIG. 3 illustrates a cross-section view 300 of an example media-streaming device including elements of a thermal-control system. The media-streaming device may be the media-streaming device 102 of FIG. 1.

The thermal-control system includes a first air gap 302 and a second air gap 304. In general, the first air gap 302 and the second air gap 304 may contribute to thermal resistances within the thermal-control system.

In FIG. 3, the first graphite sheet 214 is fixed to the first generally concave interior surface 216 of the first housing component 210. The first housing component 210 may include a plastic material. In some instances, the first graphite sheet 214 may be a hybrid graphite sheet that includes a layering of one or more films that each include a graphite material, a pressure-sensitive adhesive (PSA) material, or a polyethylene terephthalate (PET) material.

The first air gap 302, as illustrated, is located between the first graphite sheet 214 and the first heat spreader 218. Also, as illustrated, the first TIM 220 is located between, and in thermal contact with, the first heat spreader 218 and the SoC IC device 202. By reducing air gaps and/or bond line gaps at respective surfaces of the SoC IC device 202 and the first heat spreader 218, the first TIM 220 improves high thermal-conductivity and increases an efficiency and an effectiveness with which the SoC IC device 202 and the first heat spreader 218 exchange heat.

The first TIM 220, in some instances, may include a first thermal gel material (e.g., a thermally conductive gel material) that includes a silicone-rubber material injected with nanoparticles such as aluminum nanoparticles. The first TIM 220 may, in other instances, include a thermal pad material that includes a preformed solid material that is silicone or paraffin wax-based.

The first heat spreader 218, in some instances, may be enhanced with one or more first recess(es) 306 that can mitigate a hot spot. In some instances, the first heat spreader 218 may be formed from an aluminum material that is less than or equal to 0.20 mm thick.

As illustrated in FIG. 3, the first heat spreader 218 includes the first recess 306 on one surface (e.g., surface facing the first graphite sheet 214) and a corresponding first protrusion 308 formed on an opposing surface (e.g., surface facing the PCB 206). The first recess 306 forms a cavity with an opening that is exposed to (and faces) the first graphite sheet 214 while the first protrusion 308 is in thermal contact with the first TIM 220. An area of the first protrusion 308 that is in thermal contact with the first TIM 220 may be approximate to, or larger than, another area corresponding to a surface area of the first TIM 220.

If the first heat spreader 218 includes the first recess 306, origination of thermal convection and/or radiation from the first heat spreader 218 to the first graphite sheet 214 may change from a focused region (e.g., the "hot spot" corresponding a surface area of SoC IC device 202) to an annular ring (e.g., the "hot ring") that has an area that is larger than that of the focused region. This may, in some instances, improve heat transfer to, and heat transfer throughout, the first graphite sheet 214 to improve an efficiency of heat transfer from the first graphite sheet 214 to the first housing component 210.

In some instances, the first heat spreader 218 may be integrated as a portion of a first electromagnetic interference (EMI) shield structure 310 that is within the media-streaming device 102. In such an instance, a first thermally-conductive foam material 312 may be located between, and be in thermal contact with, the first heat spreader 218 and another portion of the first EMI shield structure 310. Moreover, the first heat spreader 218 may also perform EMI-shielding functions (in addition to heat-spreading functions). In general, by integrating the first heat spreader 218 as a portion of the first EMI shield structure 310, the hanging-weight of the media-streaming device 102 may be reduced.

FIG. 3 also illustrates the second graphite sheet 222 fixed to the second generally concave interior surface 224 of the second housing component 212. The second housing component 212 may include a plastic material. In some instances, the second graphite sheet 222 may be a hybrid graphite sheet that includes a layering of one or more films that include a graphite material, a PSA material, or a PET material.

The second air gap 304, as illustrated, is located between the second graphite sheet 222 and the second heat spreader 226. As further illustrated, the second TIM 228 is located between, and in thermal contact with, the second heat spreader 226 and an IC device 314 (e.g., an IC device that is other than the SoC IC device 202, such as a memory IC device, a wireless-communication IC device, and so on). By reducing air gaps and/or bond line gaps at respective surfaces of the IC device 314 and the second heat spreader 226, the second TIM 228 improves high thermal-conductivity and increases an efficiency and an effectiveness with which an IC device 314 and the second heat spreader 226 exchange heat. The second TIM 228, in some instances, may include a thermal gel material (e.g., a thermally conductive gel material) that includes a silicone-rubber material injected with nanoparticles such as aluminum nanoparticles. The second TIM 228 may, in other instances, be a thermal pad, including a preformed solid material that is silicone or paraffin wax-based.

The second heat spreader 226, in some instances, may be enhanced with one or more second recess(es) 316 that can transform a "hot spot" into a "hot ring." In some instances, the second heat spreader 226 may be formed from an aluminum material that is less than or equal to 0.20 mm thick.

As illustrated in FIG. 3, the second heat spreader 226 includes the second recess 316 on one surface (e.g., surface facing the second graphite sheet 222) and a corresponding second protrusion 318 formed on an opposing surface (e.g., surface facing the PCB 206). The second recess 316 forms a cavity with an opening that is exposed to (and faces) the second graphite sheet 222 while the second protrusion 318 is in thermal contact with the second TIM 228. An area of the second protrusion 318 that is in thermal contact with the second TIM 228 may be approximate to, or larger than, another area corresponding to a surface area of the second TIM 228.

If the second heat spreader 226 includes the second recess 316, origination of thermal convection and/or radiation from the second heat spreader 226 to the second graphite sheet 222 may change from a focused region (e.g., the hot spot corresponding to a surface area of the IC device 314) to an annular ring (e.g., the hot ring) that has an area that is larger than that of the focused region. This may, in some instances, improve heat to, and heat transfer throughout, the second graphite sheet 222 to improve an efficiency of heat transfer from the second graphite sheet 222 to the second housing component 212.

In some instances, the second heat spreader 226 may be integrated as a portion of a second EMI shield structure 320 that is within the media-streaming device 102. In such an instance, a second thermally conductive foam material 222 may be located between, and be in thermal contact with, the second heat spreader 226 and another portion of the second EMI shield structure 320. Moreover, the second heat spreader 226 may also perform EMI-shielding functions (in addition to heat-spreading functions). In general, by integrating the second heat spreader 226 as a portion of the second EMI shield structure 320, the hanging-weight of the media-streaming device 102 may be reduced.

Also illustrated in FIG. 3 are a USB port 322 and an HDMI connector/cable structure 324. By reducing the hanging-weight of the media-streaming device 102 (e.g., by integrating the first heat spreader 218 as part of the first EMI shield structure 310 and integrating the second heat spreader 226 as part of the second EMI structure 320), damage to a USB port 322 and/or an HDMI connector/cable structure 324 may be avoided.

Figure 4:
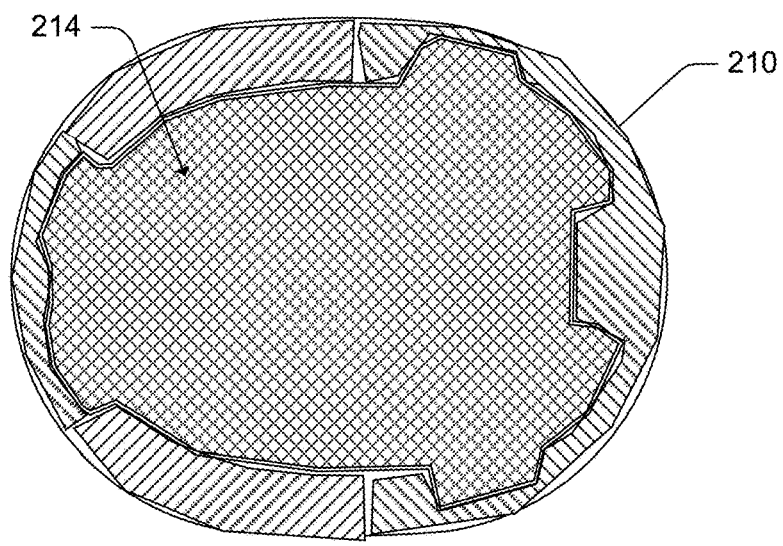
FIG. 4 illustrates a top view of an example graphite sheet that is fixed to an interior surface of a housing component.

FIG. 4 illustrates a top view 400 of an example graphite sheet that is fixed to a housing component. The graphite sheet may be the first graphite sheet 214 and may be fixed to an interior surface of the first housing component 210 of FIGS. 1 and 2 (e.g., fixed to the first generally concave interior surface 216 as illustrated in FIGS. 1 and 2).

As illustrated by FIG. 4, the first graphite sheet 214 may have a first footprint 402 that excludes first antenna area 404 of the first housing component 210. The first antenna area 404 enables electromagnetic waves (e.g., wireless communications) to be transmitted or received by antennas of a wireless-streaming device without interference from the first graphite sheet 214. Also, as illustrated by FIG. 3, the first footprint 402 of the first graphite sheet 214 excludes first structural area 406 of the first housing component 210. The first structural area 406 enables assembling the first housing component 210 to another housing component without interference from hardware (screws, fasteners, etc.).

Figure 5:
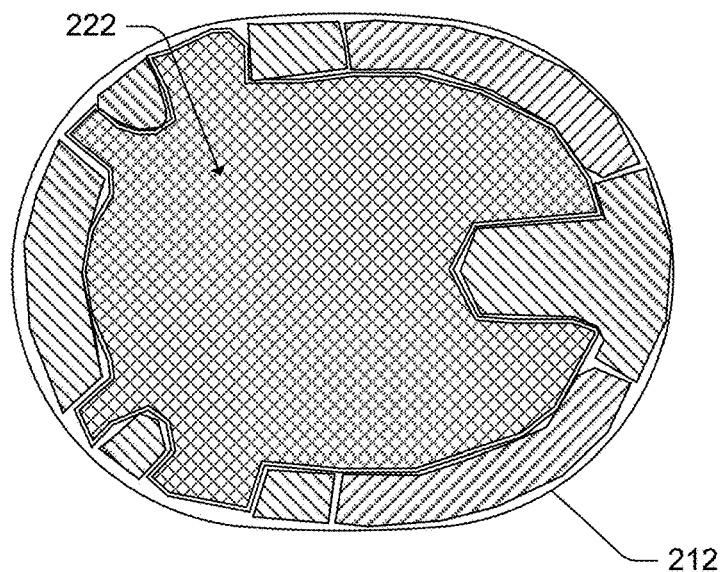
FIG. 5 illustrates a top view of another example graphite sheet that is fixed to an interior surface of another housing component.

FIG. 5 illustrates a top view 500 of another example graphite sheet that is fixed to a housing component. The graphite sheet may be the second graphite sheet 222 and may be fixed to an interior surface of the second housing component 212 of FIGS. 1 and 2 (e.g., fixed to the second generally concave interior surface 224 as illustrated in FIGS. 1 and 2).

As illustrated by FIG. 5, the second graphite sheet 222 may have a second footprint 502 that excludes a second antenna area 504 of the second housing component 212. The second antenna area 504 enables electromagnetic waves (e.g., wireless communications) to be transmitted or received by antennas of a wireless-streaming device without interference from the second graphite sheet 222. Also, as illustrated by FIG. 5, the second footprint 502 of the second graphite sheet 222 excludes second structural area 506 of the second housing component 212. The second structural area 506 enables assembling the second housing component to another housing component without interference from hardware (screws, fasteners, etc.).

Figure 6:
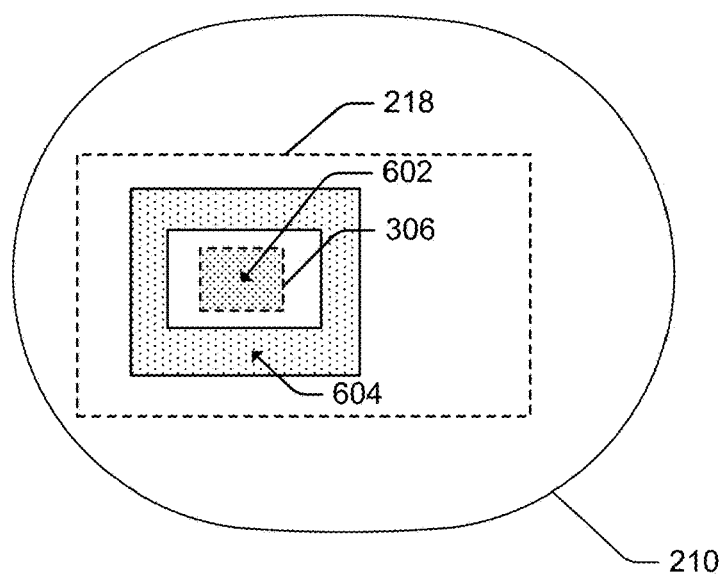
FIG. 6 illustrates a top view of a housing component, including an example thermal impact of a heat spreader located near the housing component.

FIG. 6 illustrates a top view 600 of the first housing component 210, including and an example thermal impact of the first heat spreader 218 located near the second housing component 212. The first heat spreader 218 is located within the first housing component 210 (e.g., facing the first graphite sheet 214 and the first generally concave interior surface 216 of the first housing component 210 as illustrated in FIGS. 2 and 3).

As illustrated, the first recess 306 (illustrated with a hidden, dashed line) corresponds to a hot spot 602. Without the first recess 306 incorporated as part of the first heat spreader 218, a temperature of the hot spot 602 may exceed a prescribed temperature threshold (e.g., an allowable ergonomic touch temperature) of the first housing component 210. However, the recess 306 may, in certain instances, increase a dimension of an air gap (e.g., the first air gap 302 of FIG. 3) to increase a thermal resistance and divert heat transfer from within the recess 306. This can result in annular region 604 (e.g., a "ring"), effectuating a distribution of heat across a greater area of the housing component 210 to lower the temperature.

Figure 7:
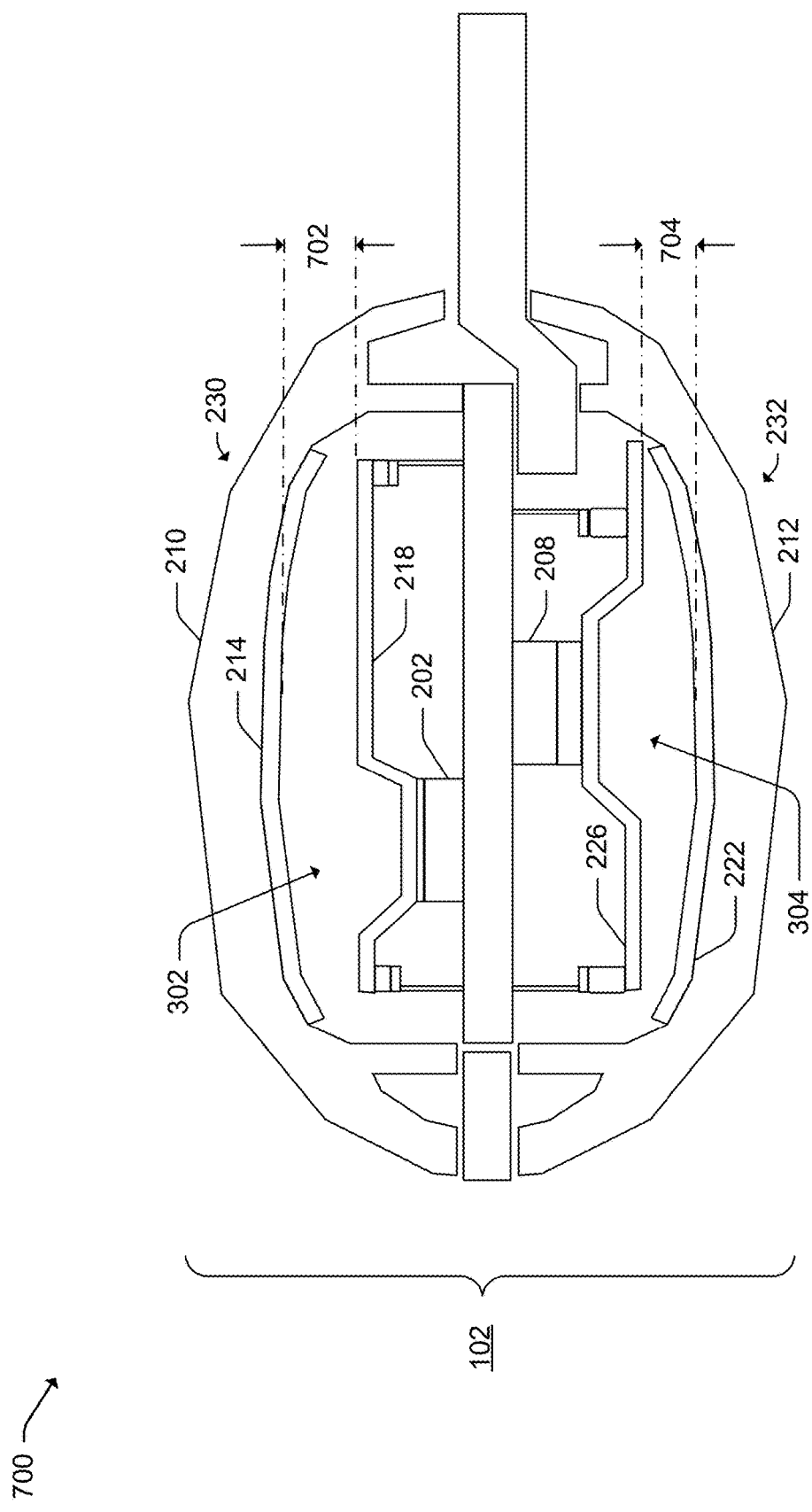
FIG. 7 illustrates a cross-section view of a media-streaming device, including an example thermal-stacking configuration of a thermal-control system.

FIG. 7 illustrates a cross-section view 700 of the media-streaming device 102, including an example thermal-stacking configuration of a thermal-control system. In general, an internal thermal-stacking configuration (e.g., a specific arrangement of energy-transfer mechanisms such as heat spreaders, graphite sheets, TIMS, and/or air gaps) can influence how heat transfers to surfaces of the media-streaming device 102 (e.g., the first exterior surface 230 of the first housing component 210 and the second exterior surface 232 of the second housing component 212) for dissipation to a surrounding environment. Without a proper internal thermal-stacking configuration, and due to high power dissipation of some components (e.g., the SoC IC device 202), temperatures for portions of the media-streaming device 102 may run at temperatures that are higher than other temperatures of other portions of the media-streaming device 102 during a thermal-loading condition. In general, a symmetrical, internal thermal-stacking configuration within the media-streaming device 102 may result in ineffective and inefficient heat transfer from the media-streaming device 102.

As previously described by equation (4), reducing temperature differences across exterior surfaces of the media-streaming device 102 can improve an efficiency and effectiveness of heat transfer from the media-streaming device 102 to a surrounding environment. Reducing temperature differences across the exterior surfaces improves the CTS of, and heat transfer from, the media-streaming device.

As illustrated by FIG. 7, the internal thermal-stacking configuration is asymmetrical. The first air gap 302 separates the first heat spreader 218 and the first graphite sheet 214 by a first distance 702. The second air gap 304 separates the second heat spreader 226 and the second graphite sheet 222 by a second distance 704. In this instance, the first distance 702 may be greater than the second distance 704, effective to increase thermal resistance of a heat flow path between the SoC IC device 202 and the first exterior surface 230 of the first housing component 210. In some instances, this may decrease a rate of heat transfer from the SoC IC device 202 to the first housing component 210 and increase another rate of heat transfer from the SoC IC device 202 to the second housing component 212, balancing temperatures of exterior surfaces of the first housing component 210 and the second housing component 212 (e.g., the first exterior surfaces 230 and 232, respectively).

Figure 8:
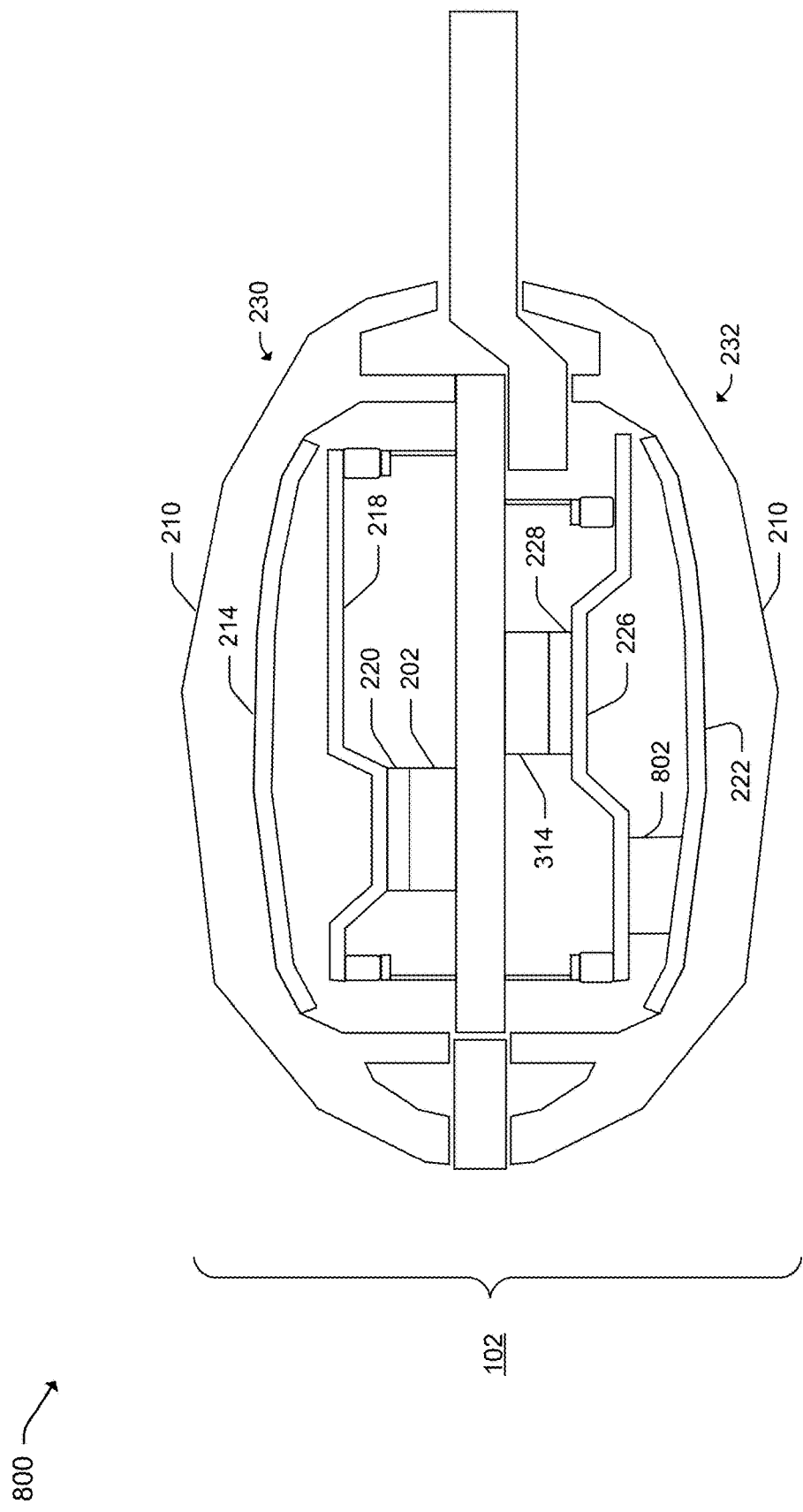
FIG. 8 illustrates a cross-section view of a media-streaming device, including another example thermal-stacking configuration of a thermal-control system.

FIG. 8 illustrates a cross-section view 800 of the media-streaming device 102, including another example thermal-stacking configuration of a thermal-control system. As illustrated by FIG. 8, a portion of the internal thermal-stacking configuration includes the first TIM 220, the first heat spreader 218, and the first graphite sheet 214 that may transfer a quantity of heat from the SoC IC device 202 to the first exterior surface 230 of the first housing component 210 for dissipation.

FIG. 8 also illustrates another portion of the internal thermal-stacking configuration, which includes the second TIM 228, the second heat spreader 226, the second graphite sheet 222, and one or more third TIM(s) 802. The one or more third TIM(s) 802, located between the second heat spreader 226 and the second graphite sheet 222, may provide a thermal conduction path between the second heat spreader 226 and the second graphite sheet 222, effective to reduce thermal resistance of a heat flow path between the IC device 314 and the second exterior surface 232 of the second housing component 212. In some instances, this may increase a rate of heat transfer from the SoC IC device 202 to the second housing component 212 and decrease another rate of heat transfer from the IC device 314 to the first housing component 210, substantially balancing the temperatures of exterior surfaces of the first housing component 210 and the second housing component 212 (e.g., the first exterior surfaces 230 and 232, respectively).

Figure 9:
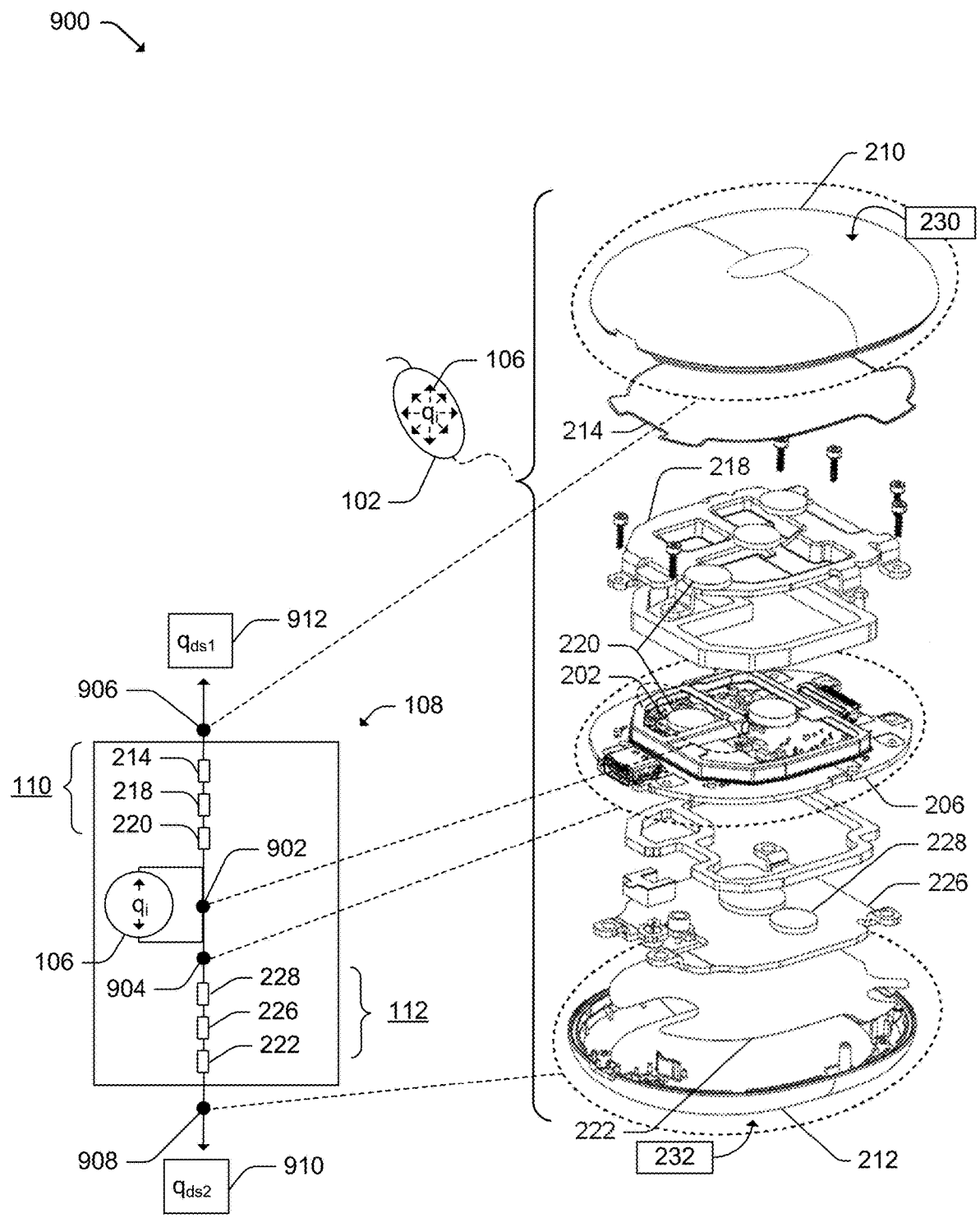
FIG. 9 illustrates example details of multiple thermal zones across a media-steaming device.

FIG. 9 illustrates example details 900 of multiple thermal zones across the media-streaming device 102. FIG. 9 includes a schematic of the thermal-control system 108. The schematic, also referred to as a thermal circuit diagram, depicts sources of thermal loading and paths for heat transfer within the media-streaming device 102. In general, the thermal-control system 108 may spread and transfer energy from a thermal-loading condition (e.g., the internal heat load 106) effectuated upon the media-streaming device 102 to concurrently maintain temperatures of the multiple thermal zones within the media-streaming device 102 at or below multiple respective temperature thresholds.

The multiple thermal zones include a first thermal zone 902 that includes the SoC IC device 202. The first thermal zone 902 may have a first prescribed temperature threshold corresponding to an allowable junction temperature of a diode within the SoC IC device 202 under the thermal-loading condition (e.g., the internal heat load 106 exuding heat at a rate of up to 4 W upon the media-streaming device 102). As an example, the first prescribed temperature threshold may be approximately 95° C. In such an instance, the thermal-control system 108 may spread and transfer energy (e.g., heat) throughout the media-streaming device 102 to maintain the first thermal zone 902 at or below the first prescribed temperature threshold (e.g., the junction temperature of the diode within the SoC IC device 202 may be maintained at or below 95° C. under the thermal-loading condition).

The multiple thermal zones also include a second thermal zone 904 having the second surface 208 of the PCB 206. The second thermal zone 904 may have a second prescribed temperature threshold that may be approximately 85° C. In such an instance, the thermal-control system 108 may spread and transfer energy (e.g., heat) throughout the media-streaming device 102 to maintain the second thermal zone 904 at or below the second prescribed temperature threshold (e.g., an allowable surface temperature of the second surface 208 of the PCB 206 at or below 85° C.).

A third thermal zone 906 that includes the first housing component 210 is also part of the multiple thermal zones. The third thermal zone 906 may have a third prescribed temperature threshold corresponding to a first allowable ergonomic touch temperature of the first exterior surface 230 of the first housing component 210. As an example, the third prescribed temperature threshold may be approximately 72° C. In such an instance, the thermal-control system 108 may concurrently spread and transfer energy (e.g., heat) throughout the media-streaming device 102 to maintain the third thermal zone 906 at or below the third prescribed temperature threshold (e.g., the first allowable ergonomic touch temperature of the first exterior surface 230 of first housing component 210 may be maintained at or below 72° C. under the high thermal-loading condition).

A fourth thermal zone 908 including the second housing component 212 is also part of the multiple thermal zones. The fourth thermal zone 908 may have a fourth prescribed temperature threshold corresponding to a second allowable ergonomic touch temperature of the second exterior surface 232 of the second housing component 212. As an example, the fourth prescribed temperature threshold may be approximately 72° C. In such an instance, the thermal-control system 108 may spread and transfer energy (e.g., heat) throughout the media-streaming device 102 to maintain the fourth thermal zone 908 at or below the fourth prescribed temperature threshold (e.g., the second allowable ergonomic touch temperature of the second exterior surface 232 of the second housing component 212 may be maintained at or below 72° C. under the high thermal-loading condition).

The thermal-control system 108 may concurrently transfer and spread energy (e.g., heat from the internal heat load 106) using convection and radiation heat transfer throughout the media-streaming device. The heat may subsequently be dissipated through the first exterior surface 230 of the first housing component 210 and the second exterior surface 232 of the second housing component 212. In general, the thermal-control system 108 may concurrently maintain temperatures of the four thermal zones (902, 904, 906, 908) at or below respective prescribed temperature thresholds. Furthermore, the thermal-control system 108 may be a passive thermal-control system (e.g., absent fans, pumps, or other active heat-transfer mechanisms).

In some instances, and as quantified by equation (4) described above, an effective CTS of the thermal-control system 108 may balance a rate of heat dissipated from a first surface (e.g., $q_{ds1}$ 912) and a rate of heat dissipated from a second surface (e.g., $q_{ds2}$ 910) such that a difference in temperature between the third thermal zone 906 and the fourth thermal zone 908 (e.g., the difference in temperature between the first exterior surface 230 of the first housing component 210 and the second exterior surface 232 of the second housing component 212) may be less than 2° C.

In some instances, the thermal-control system 108 may include elements of the SoC IC device thermal-control subsystem 110. For example, the thermal-control system 108 may include one or more of the first graphite sheet 214, the first heat spreader 218, or the first TIM(s) 220.

In addition, and in some other instances, the thermal-control system 108 may include elements of the other IC device(s) thermal-control subsystem 112. For example, the thermal-control system 108 may include one or more of the second graphite sheet 222, the second heat spreader 226, or the second TIM(s) 228.

Although techniques using and apparatuses for a thermal-control system of a media-streaming device are described, it is to be understood that the subject of the appended claims is not necessarily limited to the specific features or methods described. Rather, the specific features and methods are disclosed as example ways in which a thermal-control system of a media-streaming device can be implemented.

What is claimed is:

1. A thermal-control system for a media-streaming device, the thermal-control system comprising:
   a first thermal-control subsystem comprising:
      a first graphite sheet, the first graphite sheet fixed to a first concave interior surface of a first housing component;
      a first heat spreader, the first heat spreader separated from the first graphite sheet by a first air gap; and
      a first thermal interface material, the first thermal interface material located between the first heat spreader and a first integrated circuit device mounted to a first surface of a printed circuit board; and
   a second thermal-control subsystem comprising:
      a second graphite sheet, the second graphite sheet fixed to a second concave interior surface of a second housing component, the second concave interior surface of the second housing component facing the first concave interior surface of the first housing component;
      a second heat spreader, the second heat spreader separated from the second graphite sheet by a second air gap; and a second thermal interface material, the second thermal interface material located between the second heat spreader and a second integrated circuit device that is mounted to a second surface of the printed circuit board, the second surface of the printed circuit board opposite the first surface.

2. The thermal-control system of claim 1, wherein:
the first heat spreader includes a first recess forming a first cavity, the first cavity having a first opening facing the first graphite sheet; and
the second heat spreader includes a second recess forming a second cavity, the second cavity having a second opening facing the second graphite sheet.

3. The thermal-control system of claim 1, wherein the first graphite sheet or the second graphite sheet includes a layer of one or more films that include a graphite material, a pressure-sensitive adhesive material, or a polyethylene terephthalate material.

4. The thermal-control system of claim 1, wherein the first graphite sheet is formed around an antenna area of the media-streaming device.

5. The thermal-control system of claim 1, wherein:
the first heat spreader is integrated as part of a first electromagnetic interference shield structure surrounding the first integrated circuit device; and
the first integrated circuit device is a system-on-chip integrated circuit device.

6. The thermal-control system of claim 5, wherein the second heat spreader is integrated as part of a second electromagnetic interference shield structure.

7. The thermal-control system of claim 5, wherein the second heat spreader includes an aluminum material that is approximately 0.20 millimeters thick.

8. The thermal-control system of claim 1, wherein a first thermally conductive foam is between the first heat spreader and the first electromagnetic interference shield structure.

9. The thermal-control system of claim 1, wherein the second graphite sheet has a footprint that excludes a structural area of the media-streaming device and enables assembling the second housing component to the first housing component without interference from hardware.

10. The thermal-control system of claim 1, wherein the second graphite sheet includes a later of one or more films, the one or more films including a graphite material, a pressure-sensitive adhesive material, or a polyethylene terephthalate material.

11. The thermal-control system of claim 1, wherein the first air gap and the second air gap are asymmetrical.

12. The thermal-control system of claim 1, wherein a third thermal interface material is located between the first heat spreader and the first graphite sheet.

13. The thermal-control system of claim 1, wherein a third thermal interface material is located between the second heat spreader and the second graphite sheet.

14. A media-streaming device comprising:
a housing comprising a first housing component and a second housing component joined together;
a system-on-chip integrated-circuit device mounted to a first surface of a printed circuit board, the printed circuit board positioned within the housing; and
a thermal-control system configured to concurrently maintain temperatures throughout the media-streaming device during a thermal-loading condition, the thermal-control system positioned within the housing and configured to concurrently maintain:
a first temperature of a first thermal zone at or below a first prescribed temperature threshold, the first thermal zone including the system-on-chip integrated circuit device;
a second temperature of a second thermal zone at or below a second prescribed temperature threshold, the second thermal zone including a second surface of the printed circuit board that is opposite the first surface of the printed circuit board;
a third temperature of a third thermal zone at or below a third prescribed temperature threshold, the third thermal zone including a first exterior surface of the first housing component; and
a fourth temperature of a fourth thermal zone at or below a fourth prescribed temperature threshold, the fourth thermal zone including a second exterior surface of the second housing component.

15. The media-streaming device of claim 14, wherein the media-streaming device is a oblate spheroid.

16. The media-streaming device of claim 15, wherein the first prescribed temperature threshold corresponds to an allowable junction temperature of the system-on-chip integrated-circuit device, the allowable junction temperature of the system-on-chip integrated-circuit device being at or below to approximately 95° C.

17. The media-streaming device of claim 15, wherein the second prescribed temperature threshold corresponds to an allowable surface temperature of a second surface of the printed circuit board that is opposite the first surface, the allowable surface temperature of the second surface of the printed circuit board being at or below approximately 85° C.

18. The media-streaming device of claim 15, wherein the third prescribed temperature threshold corresponds to a first allowable ergonomic touch temperature of the first exterior surface of the first housing component, the first allowable ergonomic touch temperature being at or below approximately 72° C.

19. The media-streaming device of claim 15, wherein the fourth prescribed temperature threshold corresponds to a second allowable ergonomic touch temperature of the second exterior surface of the second housing component, the second allowable ergonomic touch temperature being at or below approximately 72° C.

20. The media-streaming device of claim 15, wherein the media-streaming device further includes a high-definition multimedia interface (HDMI) connector and a universal serial bus (USB) connector.

* * * * *